United States Patent
Reddy

(10) Patent No.: US 7,974,373 B2
(45) Date of Patent: Jul. 5, 2011

(54) METHOD AND ARCHITECTURE FOR DIGITAL PULSE SHAPING AND RATE CONVERSION

(75) Inventor: Ajit Kumar Reddy, Matawan, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 887 days.

(21) Appl. No.: 11/717,258

(22) Filed: Mar. 13, 2007

(65) Prior Publication Data

US 2008/0225935 A1    Sep. 18, 2008

(51) Int. Cl.
*H04B 1/10*    (2006.01)

(52) U.S. Cl. ........ 375/350; 375/342; 375/343; 375/349; 375/355; 375/371; 375/336; 375/337; 375/345

(58) Field of Classification Search .................. 375/259, 375/254, 260, 295, 299, 316, 342, 343, 349, 375/350, 354, 355, 371, 327, 359
See application file for complete search history.

(56) References Cited

U.S. PATENT DOCUMENTS

| | | |
|---|---|---|
| 4,584,541 A | 4/1986 | Nossen |
| 5,418,818 A | 5/1995 | Marchetto et al. |
| 5,424,286 A | 6/1995 | Eng |
| 5,490,172 A | 2/1996 | Komara |
| 5,812,607 A | 9/1998 | Hutchinson, IV et al. |
| 6,389,078 B1 | 5/2002 | Hessel et al. |
| 6,653,909 B2 | 11/2003 | Nielsen |
| 7,038,730 B2* | 5/2006 | Markman et al. ............. 348/607 |
| 7,342,525 B2* | 3/2008 | Kang et al. .................... 341/143 |
| 7,774,395 B2* | 8/2010 | Wagner ......................... 708/319 |
| 2002/0083109 A1* | 6/2002 | Willson et al. ................ 708/700 |
| 2003/0072284 A1* | 4/2003 | Webster et al. ............... 370/335 |
| 2003/0156630 A1* | 8/2003 | Sriram et al. .................. 375/148 |
| 2004/0208157 A1* | 10/2004 | Sander et al. .................. 370/345 |
| 2006/0176990 A1* | 8/2006 | Oishi et al. .................... 375/350 |
| 2007/0189431 A1* | 8/2007 | Waheed et al. ................ 375/376 |
| 2009/0141828 A1* | 6/2009 | Huang et al. .................. 375/296 |
| 2009/0245220 A1* | 10/2009 | Dick et al. ..................... 370/342 |

* cited by examiner

*Primary Examiner* — Shuwang Liu
*Assistant Examiner* — Hirdepal Singh
(74) *Attorney, Agent, or Firm* — Allen, Dyer, Doppelt, Milbrath & Gilchrist, P.A.

(57) ABSTRACT

A method and architecture for pulse shaping are provided. The architecture includes a pulse shaping filter having a plurality of memory elements and a plurality of taps connected to the plurality of memory elements wherein a total number of the plurality of taps is independent of a sampling rate. The pulse shaping filter further includes a selector configured to select outputs from the plurality of taps to define a pulse shaped output.

13 Claims, 2 Drawing Sheets

METHOD AND ARCHITECTURE FOR DIGITAL PULSE SHAPING AND RATE CONVERSION

BACKGROUND OF THE INVENTION

This invention relates generally to wireless communication systems, and more particularly, to filters for pulse shaping in wireless communication systems.

Wireless communication systems are increasingly required to handle more voice capacity. Multimedia applications are also requiring additional transmission capacities. This increased required capacity has resulted in a need for higher spectral efficiency, which is essentially the amount of information that can be transmitted over a given bandwidth in a digital communication system. The spectral efficiency is a measure of the efficiency of the use of a frequency spectrum by a physical layer protocol. Accordingly, the spectral efficiency is the channel capacity or maximum throughput of a communication link when a particular communication method is used, for example, when a particular modulation scheme is used.

In response to this need for higher spectral efficiency, higher order modulation schemes, as well as improved channel coding techniques have been developed. In digital communications, a digital signal is modulated onto an analog carrier frequency using a keying scheme, for example, a Gaussian-filtered Minimum Shift Keying (GMSK) scheme. A GMSK scheme is a type of continuous phase frequency-shift keying that has a high spectral efficiency and that may be used, for example, in a Global System for Mobile Communications (GSM) network or system, and which may be referred to generally as GSM keying.

Known systems for providing GSM keying use a sample rate conversion to, for example, upsample the signal. The upsampling is performed using signal taps of a filter. The number of signal taps increase as the length of the filter providing the GSM keying increases, for example, when operating at higher frequencies. As the number of taps increase to provided operation at the higher frequencies, the number of components associated therewith also must increase. For example, the number of multipliers that are used to process the signals from each tap also must increase. Accordingly, at this higher frequency operation with more taps, power consumption is increased to operate all of the additional components, thereby increasing power consumption requirements and reducing, for example, battery life. Further, the complexity of the controls also increases. Additionally, the space, for example, in a chip, to accommodate these additional components increases, which can increase the overall size of the chip. Thus, the size of the case for the chip also may have to be increased, resulting in a physically larger overall device, which is undesirable in mobile devices.

BRIEF DESCRIPTION OF THE INVENTION

In one embodiment, a pulse shaping filter is provided that includes a plurality of memory elements and a plurality of taps connected to the plurality of memory elements wherein a total number of the plurality of taps is independent of a sampling rate. The pulse shaping filter further includes a selector configured to select outputs from the plurality of taps to define a pulse shaped output.

In another embodiment, a method of pulse shaping is provided. The method includes generating coefficient values without using multipliers and storing the coefficient values in a plurality of memory elements. The method further includes varying the stored coefficient values and generating a pulsed shaped output based on the stored coefficient values.

In yet another embodiment, a pulse shaping filter is provided that includes a coefficient generating portion configured to generate coefficient values without using multipliers. The pulse shaping filter further includes a pulse shaping portion connected to the coefficient generating portion and configured to receive the coefficient values and generate a pulse shaped output.

DETAILED DESCRIPTION OF THE INVENTION

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

Figure 1:
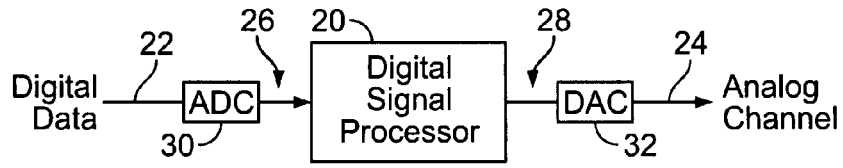
FIG. 1 is a block diagram of digital signal processor in connection with which various embodiments of the invention may be implemented.

Various embodiments of the invention provide a method and architecture associated with a pulse shaping filter for use in digital signal processing. For example, the various embodiments may be used in connection with a Digital Signal Processor (DSP) 20 as shown in FIG. 1. The DSP 20 is used to communicate digital data 22 across and analog channel 24. The digital signal 22 may be split into a digital amplitude component and a digital phase component for processing by the DSP 20. It should be noted that at a front end 26 of the DSP 20 an analog to digital converter 30 optionally may be provided and at a back end 28 of the DSP 20 a digital to analog converter 32 optionally may be provided. These converters 30 and 32 provide the conversion for incoming and outgoing signals of the DSP 20.

In operation, the DSP 20 processes digital data to generate an output based on, for example, different sampling or weighting factors. The DSP 20 may be, for example, a general purpose microprocessor or any other processing machine, and may be configured as an application specific integrated circuit (ASIC). The DSP 20 may be a dedicated integrated circuit or may be formed using, for example, field programmable gate array chips.

Figure 2:
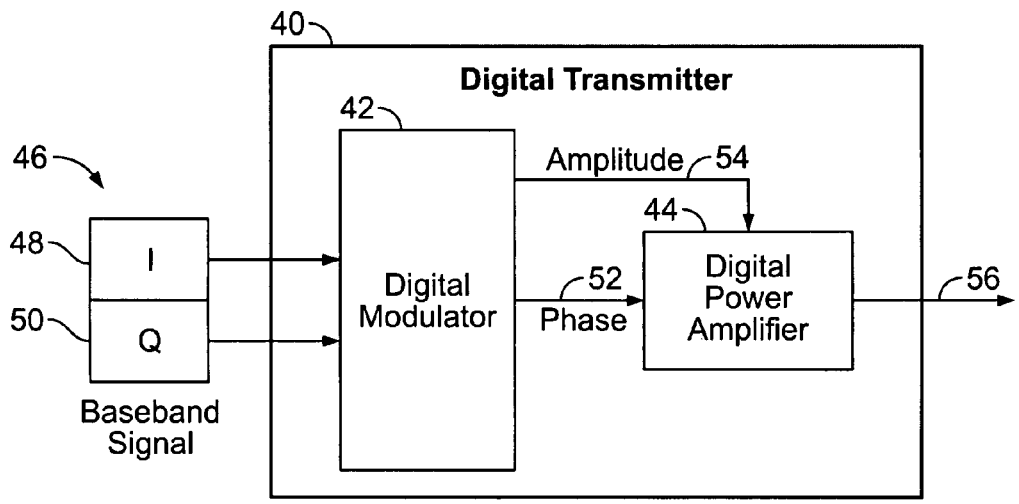
FIG. 2 is a block diagram of a digital transmitter in connection with which various embodiments of the invention may be implemented.

In one embodiment, the DSP 20 may be configured as a digital transmitter 40, shown in FIG. 2 that may be used, for example, in wireless communication systems. The digital transmitter 40 includes a digital modulator 42 connected to a digital power amplifier 44. The digital transmitter 40 interfaces directly with the digital baseband signal 46. It should be noted that digital modulator 42 and the digital power amplifier 46 may be embodied in separate integrated circuit (IC) chips.

The digital modulator 42 is configured to receive a baseband signal 46 that includes an in-phase component 48 and a quadrature component 50. Essentially these components 48 and 50 are a representation of the valued physical signal, for example, a radio frequency (RF) signal. In operation, the digital transmitter 40 splits the baseband signal 46 into a digital amplitude component and a digital phase component. The digital modulator 42 transforms the baseband signal 46 (which may be referred to as the I/Q signal) from the Cartesian domain to the polar domain. The resulting phase signal 52 and amplitude signal 54 are then provided separately to the digital power amplifier 44. The digital power amplifier 44 transforms each bit of a digital envelope formed from the received phase signal 52 and amplitude signal 54 into an instantaneous RF signal component. The individual components are combined to achieve a desired linear wideband amplitude modulation output signal 56.

The digital transmitter 40 may be tuned using, for example, an off-channel synthesizer (not shown) that supports different frequency bands. Different modes of operation also may be provided, for example, by reconfiguring frequency, clocks and filtering coefficients. The digital transmitter 40 may be, for example, a programmable digital transmitter available from M/A-COM, Inc.

Figure 3:
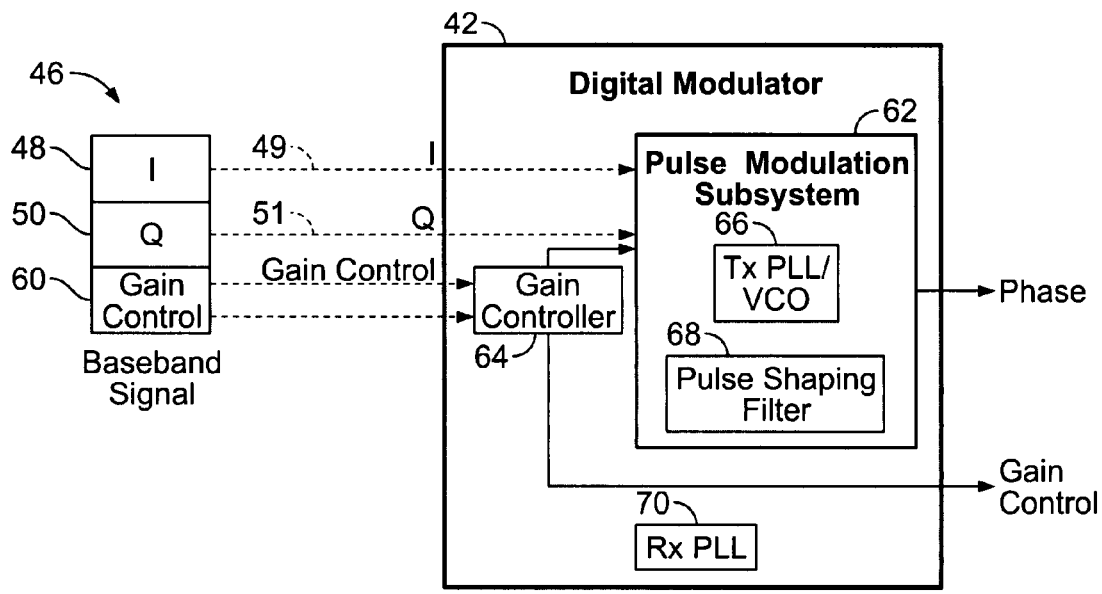
FIG. 3 is a block diagram of a digital modulator of the digital transmitter of FIG. 2.

The digital modulator 42 is shown in more detail in FIG. 3. It should be noted that the baseband signal 46 also may optionally include a gain control component 60. The digital modulator 42 includes a pulse modulation subsystem 62 and a gain controller 64. The pulse modulation subsystem 62 is configured to receive the in-phase component 48 of the baseband signal 46 and the quadrature component 48 of the baseband signal 46. The pulse modulation subsystem 62 includes a transmit phase-locked loop/voltage controller oscillator component 66 and a pulse shaping filter 68 as described in more detail below. The digital modulator also may include a receive phase-locked loop component 70.

Various embodiments of the invention provide pulse shaping for different modulation schemes. In particular, a pulse shaping filter, for example, the pulse shaping filter 68 (shown in FIG. 3) may be provided. Although the pulse shaping filter 68 may be described herein as a Gaussian pulse filter for the digital modulator 42 that is configured as a Gaussian minimum shift keying (GMSK) modulator, the pulse shape filtering of the various embodiments may be implemented with different modulation schemes including, for example, continuous phase modulation (CPM), phase-shift keying (PSK) modulation, frequency-shift keying (FSK) modulation, amplitude-shift keying (ASK) modulation, continuous-phase frequency shift keying (CPFSK) modulation, shaped offset quadrature phase shift keying (SOQPSK) modulation, minimum shift keying (MSK) modulation including different variations thereof, such as GMSK, among others.

It should be noted that when using these types of constant envelope modulation schemes, the input into the pulse shaping filter 68 is a single bit stream. Accordingly, only a single pulse shaping filter 68 is provided based on phase modulation. I and Q are derived later from the phase. For these constant envelope modulation schemes the incoming bit-stream is phase modulated only and the amplitude is constant. However, if non-constant envelope modulation schemes are used, for example, enhanced data rates for GSM evolution (EDGE), quadrature phase-shift keying (QPSK), quadrature amplitude modulation (QAM), 8 phase shift keying (8-PSK), M-ary modulation, among others, then two pulse shaping filters 68 are provided in the data path. One of the pulse shaping filters 68 is provided for the I path 49 (i.e., in-phase path) and one of the pulse shaping filters 68 is provided for the Q path 51 (i.e., quadrature path). In these non-constant envelope modulation schemes the incoming data is split into the I and Q components and the data is both amplitude modulated and phase modulated. It should be noted that the same filter structure of the embodiments shown in FIGS. 2 and 3 may be used for the different types of modulations schemes. However, depending on the modulation scheme used, modifications may be made as desired or needed to accommodate the filtering requirements, incoming data stream characteristics, etc.

Accordingly, although a description of MSK will now be described, the various embodiments may be implemented in connection with other types of keying and modulation schemes. Also, the various embodiments are not limited to pulse shaping in digital transmitters, but may be used in any system or application where pulse shaping is desired or needed. With respect to MSK, this type of keying is a special case of CPFSK. Similar to FSK, binary data is coded by two frequency tones, but the signal maintains a continuous phase between consecutive bits. This phase continuity property is the major reason for the higher bandwidth efficiency of CPFSK as compared to other FSK modulation formats. The modulated waveform of a binary CPFSK signal with symbol or bit period $T_s$, carrier frequency $f_c$ and bit energy $E_b$, may be expressed as:

$$s(t) = \sqrt{\frac{2E_b}{T}} \cos\{2\pi(f_c + a_n f_d)(t - nT) + \varphi_n\} \quad (1)$$

$$nT < t < (n+1)T,$$

where $\varphi n$ denotes the phase of the signal at time nT, which is the end of the previous bit. Also $a_n$ is a polar sequence of ±1 that encodes the data. Depending on the current value of $a_n$, the frequency differs from a median value $f_c$ by a quantity of $\pm f_d$, referred to as the frequency deviation. According to Equation 1, MSK signals have a constant envelope and continuous phase, which are two major advantages of this modulation format. The ratio of $2f_d$ (which is the spacing between the two frequency-tones $f_c+f_d$ and $f_c-f_d$) to the bit rate is called the modulation index, represented by h, where:

$$h = 2f_d T \quad (2)$$

It should be noted that smaller the modulation index, the better the spectral efficiency. In the case of MSK, the modulation index is equal to 0.5. The minimum spacing for the two frequency tones to be orthogonal for coherent detection is h=0.5 for a known phase. If the phase is unknown then the two tones may no longer be orthogonal even with this minimum deviation. The signal phase $\phi_n$ at time nT, is the summation of the phase deviations of all previously transmitted symbols plus the initial phase $\phi_0$ of the carrier. Therefore, the phase of the baseband waveform can be expressed as:

$$\varphi(t) = 2\pi f_d T \sum_{k=-\infty}^{n-1} a_k + 2\pi f_d a_n (t - nT) + \varphi_0 \quad (3)$$

$$nT < t \leq (n+1)T,$$

rewriting Equation 3 results in:

$$\varphi(t) = 2\pi \int_{\tau=-\infty}^{t} f_t(t) d\tau + \varphi_0, \quad (4)$$

where $$f_i(t) = f_d \sum_{k=-\infty}^{+\infty} a_k g(t - kT), \quad (5)$$

and g(t) is a rectangular pulse of amplitude one and duration T. With the expression for phase as represented in Equation 4, the complex baseband waveform of MSK is expressed as:

$$s(t) = \sqrt{\frac{E_b}{T}} \exp\left\{j\left(2\pi \int_{\tau=-\infty}^{t} f_i(\tau) d\tau + \varphi_0\right)\right\}, \quad (6)$$

In Equation 6, $f_i(t)$ is known as the instantaneous frequency of the signal at time t.

In order to make the MSK output power spectrum more compact a pre-modulation low-pass filter (LPF) may be used that should have the following requirements:

1) narrow bandwidth and sharp cutoff to suppress high frequency components;
2) small overshoot impulse response to prevent excess deviation of the instantaneous frequency; and
3) preservation of an integrated filter output pulse capable of accommodating a 90° phase shift to ensure coherent demodulation.

In various embodiments, a pre-modulation Gaussian LPF satisfying the above requirements is used for GMSK modulation, where the data sequence (e.g., an information pulse train) is passed through a Gaussian LPF filter, and the output of the filter is MSK modulated. The width of the Gaussian filter is determined by the bandwidth-time product BT. It should be noted that different standards use different values for the bandwidth time product. For example, BT=0.3 for a Global System for Mobile Communications (GSM) standard and BT=0.5 for a Cellular Digital Packet Data (CDPD) standard. A more compact spectrum is obtained with the use of the Gaussian LPF for GMSK. The use of this filter causes the signal pulse to spread, which leads to the introduction of inter-symbol interference (ISI) in the transmitted signal. This spreading of the signal over an interval greater than T, makes GMSK a partial response signal.

The impulse response of the Gaussian LPF is:

$$h(t) = \frac{1}{\sqrt{2\pi}\,\sigma T} \exp\left(\frac{-t^2}{2\sigma^2 T^2}\right) \quad (7)$$

where $$\sigma = \frac{\sqrt{\ln(2)}}{2\pi BT}, \text{ with } BT = 0.3 \text{ for } GSM \quad (8)$$

B is the 3 dB bandwidth of the filter. The square pulse response g(t) of the Gaussian LPF is:

$$g(t) = h(t) * rect\left(\frac{t}{T}\right) \quad (9)$$

where the rectangular function rect(x) is defined by:

$$rect\left(\frac{t}{T}\right) = \begin{cases} 1/T, & \text{for } |t| < \frac{T}{2} \\ 0, & \text{otherwise} \end{cases} \quad (10)$$

The pulse response g(t) can be expressed as:

$$g(t) = \frac{1}{2T}\left[Q\left(\frac{2\pi BT(t - T/2)}{t\sqrt{\ln(2)}}\right) - Q\left(\frac{2\pi BT(t + T/2)}{t\sqrt{\ln(2)}}\right)\right] \quad (11)$$

where Q(t) is the Q-function:

$$Q(t) = \int_{t}^{\infty} \frac{1}{\sqrt{2\pi}} \exp(-x^2/2) dx \quad (12)$$

And g(t)=0, for $0 \leq t \leq LT$ with L defined as the number of intervals over which the pulse is spread. The phase of the modulated signal is expressed as:

$$\theta(t) = \sum_{k} a_k \pi h \int_{-\infty}^{t-kT} g(u) du \quad (13)$$

where $a_k \in \{\pm 1\}$ is the modulating NRZ data. The modulation index h=0.5 results in the maximum phase change of $\pi/2$ radians per data interval.

Figure 4:
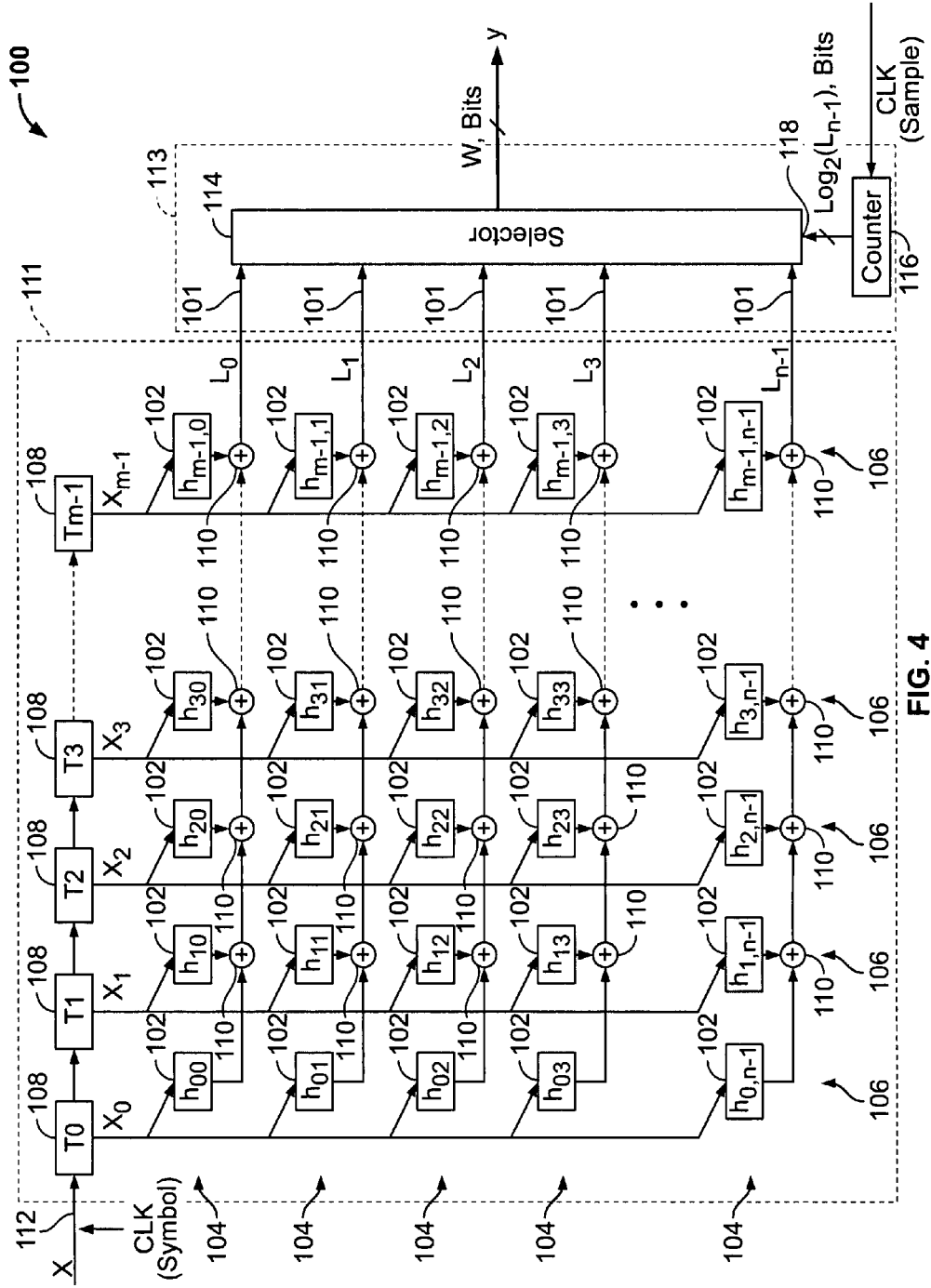
FIG. 4 is a block diagram of a filter for pulse shaping constructed in accordance with an embodiment of the invention.

Various embodiments of the present invention provide a pulse shaping filter, for example, in the case of a GMSK modulator the pulse-shaping filter is a Gaussian pulse filter 100 as shown in FIG. 4. The filter includes n−1 lanes 101 ($L_0 \ldots L_{n-1}$) of coefficient memory elements 102 ($h_{00} \ldots h_{m-1,n-1}$) arranged in a plurality of rows 104 and a plurality of columns 106 defining an array. The memory elements 102 may be any type of data storage element (e.g., Random Access Memory (RAM)) and are configured to store coefficient values. A plurality of taps 108 ($T_0 \ldots T_{m-1}$) also are provided to sample a clock signal (CLK) at different time intervals, which in one embodiment is a clock symbol signal. For example, the CLK signal may be a plurality of digital clock symbols. A symbol is generally the smallest unit of data transmitted at one time. It should be noted that the number of taps 108 and the number of lanes 101 of the filter 100 are determined by the output sampling rate and the number of coefficients of the filter 100.

Each of the lanes 101 further includes m−1 adders 110. Accordingly, with this structure that represents a parallel implementation a total of (m−1)*n adders 110 are included. It should be noted that at the time of startup, namely when the data to the filter 100 is enabled, an initial startup sequence is provided for the additions to be carried out in each of the n lanes 101 for the first m−1 symbol cycles. Additionally, a selector 114 (e.g., a multiplexer or other switch) is provided with inputs of the selector 114 connected to the plurality of lanes 101. Further, a counter 116 is connected to a control input 118 of the selector 114.

It should be noted that the value of m is greater than 1. Further, if n=1 then symbol time filtering is performed (e.g., using the input data rate) and if n is greater than one then sample rate filtering (e.g., using the output sample rate) is performed with a sample rate conversion represented by the value of n. The value of m is determined by the design of the filter (e.g., desired filter characteristics) where m=(total number of filter coefficients/n), which is greater than 1.

The plurality of memory elements 102, the plurality of taps 108 and the plurality of adders 110 generally form a coefficient generating portion 111 of the filter 100. The selector 114 and counter 116 generally form a pulse shaping portion 113 of the filter 100. The coefficient generating portion 111 generates coefficient values that may be changed. The coefficient values are provided to the pulse shaping portion 113 that generates a pulsed shape output of the filter 100. The array of memory elements 102 is of size m*n where the value of m is determined by the number of symbols, which also determines the number of taps 108 to be used in the filter 100.

It should be noted that when reference is made herein to coefficients, filter coefficients or pulse shaping coefficients, these terms are interchangeable and may refer generally to any of the following: pulse shaping coefficients, lowpass coefficients, highpass coefficients and/or bandpass coefficients, among others.

In operation, the array of memory elements 102 contains pulse shaping filter coefficients. The pulse shaping coefficients are based on pulse shaping requirements. The pulse shaping requirements vary based on a desired or required sample rate and bandwidth (e.g., depending on the particular application). The pulse shaping coefficients may be determined, for example, using simulation, testing, or other methods and based on the pulse shaping requirements. For example, one or more MATLAB® simulations (available from MathWorks, Inc.) may be performed in which different parameters (e.g., word length, bid width, band of operation, etc.) are varied and performance evaluated based on the simulations, which may include, for example, simulations using different coefficient values. Accordingly, these values are predetermined or predefined based on this simulation, testing, etc. The values of the pulse shaping coefficients may be stored in memory (not shown), for example, as a look up table. These predetermined or predefined values are then later accessed and used as the pulse shaping coefficients.

It should be noted that the filter 100 may perform both pulse shaping and rate conversion. Input data is received at a symbol rate as described herein, while output data is outputted at a sample rate. For example, assume the number of filter coefficients is 48. For a sample rate conversion of 1:16 the number of symbol taps, namely, the number of taps 108, m, is determined by m=48/16=3. Accordingly, the number of taps 108 is based, for example, on the design of the filter 100 and the sample rate as described in the above example.

The input to the tap delay line 112 is binary data clocked at the symbol clock CLK. The binary data from the respective taps 108 is connected to the columns 106 of the memory elements 102. In various embodiments, the data in the taps 108 triggers the loading of coefficients in the memory elements 102 for addition by the adders 110 according to the following:

---

If $x_k$ equals to '0' then
  $Reg_{ij} = h_{ij}$;
Else if $x_k$ equals to '1' then
  $Reg_{ij} = -h_{ij}$;
Else
  $Reg_{ij} = 0$;
where $0 \leq k < m, 0 \leq i < m$ and $0 \leq j < n$.

---

As used above, x represents the data coming into the filter, for example, the pulse shaping filter 68 shown in FIG. 3. For GMSK, CPM, etc. this data is a binary bit stream. As used above, h defines the filter coefficients stored in memory as described herein and Reg represents the corresponding filter into which the coefficient value is stored (having been retrieved from the memory).

The counter 116 is operated at a sample clock rate CLK (sample), which is n times faster than the symbol clock rate CLK (symbol). The counter 116, which in one embodiment is $Log_2(L_{n-1})$ bits wide, selects the output from each of the lanes 101, $L_p$ ($0 \leq p \leq n$), through the selector 114. For every symbol $x_k$ input into the tap delay line 112, n samples equivalent to an oversampling rate (OSR) is output from the selector 114, which is the pulse shaped output of the filter 110. It should be noted that each of the lanes 101 ($L_p$) outputs data at the sample rate and each lane 101 needs m−1 additions to be performed for each sample clock.

It further should be noted that the adders 110 for each lane 101 can be reused. Thus, only m−1 adders 110 are needed with each operating at a sample frequency $F_{samp}$, where $F_{samp}=OSR*F_{sym}$. The reuse of the adders 110 reduces the physical space needed for implementation, for example, saves real estate in an ASIC implementation. The structure of the filter 100 also can be modified to output the vectored output at a symbol rate where the size of the vector is equivalent to the number of lanes 101. Accordingly, using this structure symbol rate, filtering may be performed without rate conversion.

Thus, for example, with the filter 100 operating as a Gaussian pulse filter, the input to the filter 100 is in the form of binary bit stream {0,1} being clocked at a rate of 1/Tb, where Tb=3.692e−6 in one embodiment. Tb is the symbol time of the incoming data into the filter 100. In the described exemplary embodiment, this value is based on GSM/EDGE standards. However, different values may be used depending on the application, operating requirements, etc. Also, and for example, in other non-standard applications, this value is based on the bandwidth of the signal to be transmitted. The filtered data needs to be clocked at the sample rate of 1/Tb* over-sampling rate (OSR) or simply OSR times the symbol rate. At the OSR, the number of coefficients required for the Gaussian pulse shaping filter 100 is NSYM*OSR, where NSYM is the number of symbol intervals.

In the various embodiments, a binary to bipolar conversion is to be performed within the filter 100 coefficients are selected without using multipliers or a sample rate converting structure. The values of the coefficients would be appropriately selected and the necessary outputs computed at a sample rate conversion. Accordingly, a signed or unsigned value of the coefficient may be selected based on the binary data input.

Thus, the various embodiments provide a pulse shaping structure that can be achieved with reduced physical space (e.g., reduce chip real estate), reduced power consumption and reduced hardware complexity. The various embodiments may be modified to support m-ary modulation formats wherein the data is a multibit input. The number of taps of the pulse shaping structure is independent of a sampling rate. Thus, the length of the pulse shaping structure does not change at different sampling rates, for example, at higher frequencies.

The various embodiments or components thereof, for example, the digital signal processor 20 or filter 100 or controllers therein, may be implemented as part of one or more computer systems. The computer system may include a computer, an input device, a display unit and an interface, for example, for accessing the Internet. The computer may include a microprocessor. The microprocessor may be connected to a communication bus. The computer may also include a memory. The memory may include Random Access Memory (RAM) and Read Only Memory (ROM). The computer system further may include a storage device, which may be a hard disk drive or a removable storage drive such as a floppy disk drive, optical disk drive, and the like. The storage device may also be other similar means for loading computer programs or other instructions into the computer system.

As used herein, the term "computer" may include any processor-based or microprocessor-based system including systems using microcontrollers, reduced instruction set circuits (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer system executes a set of instructions that are stored in one or more storage elements, in order to process input data. The storage elements may also store data or other information as desired or needed. The storage element may be in the form of an information source or a physical memory element within the processing machine.

The set of instructions may include various commands that instruct the computer as a processing machine to perform specific operations such as the methods and processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

While the invention has been described in terms of various specific embodiments, those skilled in the art will recognize that the invention can be practiced with modification within the spirit and scope of the claims.

What is claimed is:

1. A pulse shaping filter comprising:
a plurality of memory elements;
a plurality of taps connected to the plurality of memory elements, a total number of the plurality of taps being independent of a sampling rate; and
a selector configured to select outputs from the plurality of taps to define a pulse shaped output;
data stored within the plurality of taps triggering the loading of coefficients into the plurality of memory elements according to the following:

If $x_k$ equals to '0' then
$Reg_{ij} = h_{ij}$;
Else if $x_k$ equals to '1' then
$Reg_{ij} = - h_{ij}$;
Else
$Reg_{ij} = 0$;
where $0 \leq k < m$, $0 \leq i < m$ and $0 \leq j < n$, m is the number of the plurality of taps, $Reg_{ij}$ is a given memory element, x is an input signal to the plurality of taps, h defines the coefficients in the plurality of memory elements, and n is a multiplier of a sample clock signal.

2. The pulse shaping filter in accordance with claim 1 wherein the pulse shaped output comprises an over-sampling rate (OSR).

3. The pulse shaping filter in accordance with claim 1 wherein the input signal to the plurality of taps comprises a symbol clock signal.

4. The pulse shaping filter in accordance with claim 3 further comprising a counter connected to the selector, and wherein the sample clock signal is also provided as an input to the counter, and wherein the sample clock signal is n times faster than the symbol clock signal.

5. The pulse shaping filter in accordance with claim 1 wherein the plurality of memory elements are configured in rows and columns, and wherein each of the plurality of taps is connected to a different column of memory elements.

6. The pulse shaping filter in accordance with claim 1 wherein the plurality of memory elements are configured in rows and columns, and further comprising a plurality of adders configured to add outputs of the memory elements in each row.

7. The pulse shaping filter in accordance with claim 1 wherein the plurality of memory elements are configured to store pulse shaping coefficients.

8. The pulse shaping filter in accordance with claim 7 wherein the pulse shaping coefficients comprise variable values.

9. The pulse shaping filter in accordance with claim 1 wherein the plurality of memory elements, the plurality of taps and the selector are configured to provide Gaussian pulse filtering.

10. The pulse shaping filter in accordance with claim 1 wherein an input signal received by the plurality of taps comprises a binary bit stream.

11. The pulse shaping filter in accordance with claim 10 wherein the binary bit stream is clocked at a rate of 1/Tb, where Tb=3.692e–6.

12. The pulse shaping filter in accordance with claim 1 further comprising a counter connected to the selector and wherein the counter has a bit width of $Log_2(L_{n-1})$.

13. A method of pulse shaping comprising:
generating coefficient values without using multipliers;
storing the coefficient values in a plurality of memory elements;
varying the stored coefficient values; and
generating a pulsed shaped output based on the stored coefficient values;
storing data within a plurality of taps connected to the plurality of memory elements;
triggering the loading of coefficients into the plurality of memory elements based upon the data stored within the plurality of taps and according to the following:

If $x_k$ equals '0' then $Reg_{ij}=h_{ij}$;

Else if $x_k$ equals '1' then $Reg_{ij}=-h_{ij}$;

Else $Reg_{ij}=0$;

where $0 \leq k<m$, $0 \leq i<m$ and $0 \leq j<n$, m is the number of the plurality of taps, $Reg_{ij}$ is a given memory element, x is an input signal to the plurality of taps, h defines the coefficients in the plurality of memory elements, and n is a multiplier of a sample clock signal.

* * * * *